(12) United States Patent
Xu

(10) Patent No.: US 6,169,431 B1
(45) Date of Patent: Jan. 2, 2001

(54) DRIVE CIRCUIT FOR A CONTROLLABLE SEMICONDUCTOR COMPONENT

(75) Inventor: Chihao Xu, München (DE)

(73) Assignee: Infineon Technologies AG, Munich (DE)

( * ) Notice: Under 35 U.S.C. 154(b), the term of this patent shall be extended for 0 days.

(21) Appl. No.: 09/477,134

(22) Filed: Jan. 3, 2000

Related U.S. Application Data

(63) Continuation of application No. PCT/DE98/01490, filed on Jun. 2, 1998.

(51) Int. Cl.$^7$ ........................................................ H03K 3/00
(52) U.S. Cl. .......................... 327/109; 327/427; 327/542
(58) Field of Search .................................... 327/108, 109, 327/110, 427, 434, 435, 437, 538, 540–543

(56) References Cited

U.S. PATENT DOCUMENTS

| 5,381,044 | 1/1995 | Zisa et al. ............................. 327/109 |
| 5,534,814 | * 7/1996 | Archer ................................. 327/427 |
| 5,539,352 | * 7/1996 | Du Puy ................................ 327/538 |
| 5,923,210 | * 7/1999 | Le et al. ............................... 327/538 |

FOREIGN PATENT DOCUMENTS

| 33 14 300 A1 | 10/1984 | (DE) . |
| 34 05 936 A1 | 8/1985 | (DE) . |
| 44 03 201 A1 | 8/1994 | (DE) . |
| 196 09 121 C1 | 2/1997 | (DE) . |
| 0 405 407 A2 | 1/1991 | (EP) . |
| 0 415 081 A2 | 3/1991 | (EP) . |
| 0 572 706 A1 | 12/1993 | (EP) . |
| 2 180 422 | 3/1987 | (GB) . |
| 2 288 091 | 10/1995 | (GB) . |

* cited by examiner

Primary Examiner—Toan Tran
(74) Attorney, Agent, or Firm—Herbert L. Lerner; Laurence A. Greenberg; Werner H. Stemer

(57) ABSTRACT

A drive circuit for a controllable semiconductor component, in particular for switching on a high-side MOS power transistor. The semiconductor component is connected to a first reference potential at its first main terminal and to a load at its second main terminal. The load furthermore is connected to a second reference potential. The drive circuit has a control signal generating device for generating a control signal for switching the controllable semiconductor component on and off. A capacitor device is provided which is connected to the first reference potential at its first terminal via a diode for the purpose of charging and is connected to the second main terminal of the semiconductor component at its second terminal. The drive circuit has a controllable switching device that is connected between the first terminal of the capacitor device and the control terminal of the semiconductor component. The control terminal of the switching device is connected to the second main terminal of the semiconductor component and can be controlled in such a way that it feeds a charge stored in the capacitor device to the control terminal of the semiconductor component in the switched-on state, and does not do so in the switched-off state. A switching control device for controlling the switching device in response to the control signal of the control signal generating device is also provided.

10 Claims, 3 Drawing Sheets

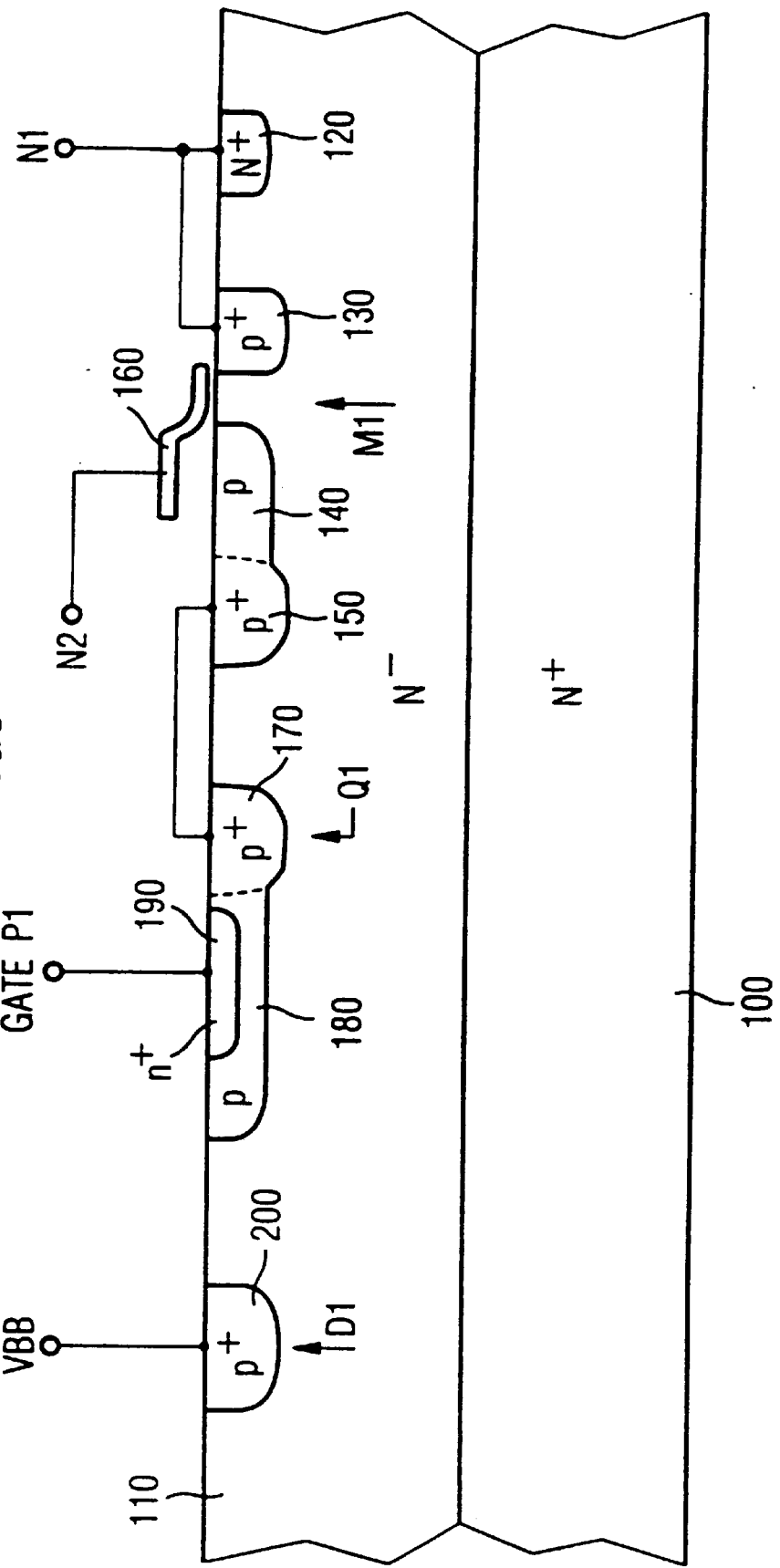

DRIVE CIRCUIT FOR A CONTROLLABLE SEMICONDUCTOR COMPONENT

CROSS-REFERENCE TO RELATED APPLICATION

This is a continuation of copending International Application PCT/DE98/01490, filed Jun. 2, 1998, which designated the United States.

BACKGROUND OF THE INVENTION

FIELD OF THE INVENTION

The present invention relates to a drive circuit for a controllable semiconductor component, in particular a drive circuit for rapidly switching on a high-side MOS power transistor. The semiconductor component is connected to a first reference potential (for example a positive pole of battery) at its first main terminal and is connected to a load at its second main terminal, and the load furthermore isg connected to a second reference potential (for example negative pole of battery).

Although it can be applied to any controllable semiconductor components, the present invention and also the problem area on which it is based are explained with regard to drive circuits for rapidly switching on a high-side MOS power transistor.

High-side MOS power transistors, which generally have intelligent supplementary circuitry, are widespread in many areas of application, in particular in modern motor vehicle electronics, on account of various advantages, such as, for example, protection against short circuits for the supply and protection against corrosion for the load.

A charge pump is required for switching on the high-side MOS power transistor; however, the charge pump is very slow and thus limits the switch-on speed. This principle does not suffice, therefore, for applications that require a high switch-on speed, for example in the ultrasonic frequency range.

A solution presented is a discrete bootstrap circuit, since an associated bootstrap capacitor cannot be integrated on the chip for viability reasons. A monolithic solution for the high-side MOS power transistor and the drive circuit (drive IC) can scarcely be realized in the case of a self-insulating process, since the free interconnectability of such a process is highly limited.

An alternative presented is a two-chip solution that provides a discrete bootstrap capacitor. This solution can readily be realized using chip-on-chip technology in a housing or else by use of two separately mounted chips.

The separate drive IC chip must also satisfy a number of far-reaching requirements. The internal IC circuit which drives the high-side MOS power transistor must be able to take up the full battery voltage, for example 12 V. This presupposes a power IC fabrication process.

Published, Non-Prosecuted German Patent Application DE 33 14 300 A1 discloses a drive circuit for a high-side NMOS power transistor which is connected between a first reference voltage potential and a load. The drive circuit furthermore has a control signal generating device and a series circuit formed by a capacitor and a diode which is connected between the main terminals of the power transistor and serves as a bootstrap device. Furthermore, provision is made of a controllable switching device in the form of an NPN bipolar transistor, whose base terminal is connected via a phototransistor to a junction point between the power transistor and the load. The aim of the drive circuit is to reduce a switching delay in a power MOSFET push-pull output stage with an optocoupler.

In Published, British Patent Application GB 2 180 422 A, the combination of a charge pump with a bootstrap circuit is provided for driving a semiconductor switch.

Published, Non-Prosecuted German Patent Application DE 0 572 706 A1 describes a drive circuit for a power FET with a load on the source side, in which the power FET is driven via a pump circuit. The pump circuit has an NPN bipolar transistor, a charge store and also a diode. These components are referred to an operating voltage $+U_{BB}$. The control of the NPN bipolar transistor is performed via a MOSFET connected between the base and the collector. The control terminal of the MOSFET is connected to a junction point of the series circuit formed by a resistor and a controllable switch. The series circuit is connected between a high supply potential and a reference-ground potential. The control terminal of the NPN bipolar transistor is furthermore connected via a further resistor to the load.

SUMMARY OF THE INVENTION

It is accordingly an object of the invention to provide a drive circuit for a controllable semiconductor component which overcomes the above-mentioned disadvantages of the prior art devices of this general type, which is simple to produce and is in particular an improved drive circuit for a high-side MOS power transistor, which enables the controllable semiconductor component to be switched on more rapidly.

With the foregoing and other objects in view there is provided, in accordance with the invention, in combination with a semiconductor component having a first main terminal connected to a first reference potential, a second main terminal connected to a second reference potential via a load, and a control terminal, a drive circuit for driving the semiconductor component, the drive circuit including:

a control signal generating device generating a control signal for switching the semiconductor component on and off, the control signal generating device has a circuit section operating according to a bootstrap principle and serving for switching on the semiconductor component;

a diode having a first terminal connected to the first reference potential and a second terminal;

a capacitor device having a first terminal connected to the second terminal of the diode for charging the capacitor device via the first reference potential and a second terminal connected to the second main terminal of the semiconductor component;

a series circuit formed of a series resistor and a first controllable NMOS transistor having a control terminal receiving the control signal from the control signal generating device, the series circuit is connected between the first terminal of the capacitor device and the second reference potential;

a controllable PMOS transistor having a control terminal connected to a junction point between the series resistor and the first controllable NMOS transistor, a first main terminal connected to a junction point between the diode and the capacitor device, and a second main terminal;

an NPN bipolar transistor having a collector terminal connected to the first terminal of the capacitor device, an emitter terminal connected to the control terminal of the semiconductor component, and a base terminal connected to the second main terminal of the controllable PMOS transistor;

an inverter receiving the control signal from the control signal generating device and outputting an inverted control signal; and a resistor device having a second controllable NMOS transistor with a first main terminal connected to the base terminal of the NPN bipolar transistor, a second main terminal connected to the second main terminal of the semiconductor component, and a control terminal receiving the inverted control signal from the inverter.

The drive circuit according to the invention has the particular advantage that the switching device in the form of the NPN bipolar transistor has a high current-carrying capacity and can be switched on rapidly by the switching control device.

The idea underlying the present invention is that the control terminal of the switching element has a fixedly defined potential in the switched-off state.

In accordance with a further preferred development, provision is made of a charge pump circuit for receiving the control signal and outputting a boosted control signal to the control terminal of the semiconductor component. This affords the advantage that the switching device can also remain permanently switched on (pulse width modulation (PWM) duty ratio=100%) should the capacitor device discharge over time.

In accordance with a preferred development, the semiconductor component is an NMOS power transistor.

In accordance with a further preferred development, the first resistor device has a second NMOS transistor, whose first main terminal is connected to the base terminal of the NPN bipolar transistor, whose second main terminal is connected to the second main terminal of the semiconductor component and whose control terminal receives the inverted control signal. This has the advantage that the first resistor device can be made to have a high resistance in the switched-on state, and therefore does not conduct away too much current, and can be made to have a low resistance in the switched-off state, and therefore the breakdown voltage $V_{CE0}$ of the switching element is not reduced to an excessively great extent.

In accordance with a further preferred development, provision is made of a voltage limiting circuit connected between the control terminal and the second main terminal of the semiconductor component and serving to limit the voltage located in between. It is thus possible to protect the control terminal of the semiconductor component against an overvoltage, in particular an overvoltage caused by the charge pump.

In accordance with a further preferred development, the voltage limiting circuit has a zener diode, whose cathode terminal is connected to the control terminal of the semiconductor component; and a third NMOS transistor, whose first main terminal is connected to the anode terminal of the zener diode, whose second main terminal is connected to the second main terminal of the semiconductor component and whose control terminal is connected to its first main terminal.

In accordance with a further preferred development, provision is made of a charge pump activation circuit for activating the charge pump circuit as a function of the voltage. This makes it possible for the charge pump to be allowed to concomitantly run only as required, that is to say, for example, not during straightforward pulse width modulation operation in the high frequency range, and to prevent unnecessary EMC interferences from being generated.

In accordance with a further preferred development, the charge pump activation circuit has a delay device for receiving and delaying the control signal. An inverter device is provided, exhibiting hysteresis, for receiving and inverting the potential present at the first control terminal of the third NMOS transistor. The charge pump activation circuit further has an AND gate device for receiving the output signals of the delay device and of the inverter device exhibiting hysteresis and outputting a correspondingly logically combined output signal for activating the charge pump circuit.

In accordance with a further preferred development, provision is made of a voltage regulating circuit for detecting the voltage located between the control terminal and the second main terminal of the semiconductor component and regulating the driving of the switching element as a function thereof. It is thus possible to protect the control terminal of the semiconductor component more extensively against an overvoltage, in particular an overvoltage caused by the capacitor device or battery.

In accordance with a further preferred development, the voltage regulating circuit has a second resistor device, whose first terminal is connected to the first terminal of the capacitor device. A fourth NMOS transistor with a first main terminal connected to the second terminal of the third resistor device, a second main terminal connected to the second main terminal of the semiconductor component and a control terminal connected to the control terminal of the third NMOS transistor is further provided. Additionally, the voltage regulating circuit has a second PMOS transistor with a first main terminal connected to the first terminal of the capacitor device, a second main terminal connected to the control terminal of the first PMOS transistor and a control terminal connected to the second terminal of the second resistor device.

In accordance with a further preferred development, a series circuit formed by a third resistor device and a second capacitor device is provided, for the purpose of stabilizing the regulation, between the second main terminal of the second PMOS transistor and the first main terminal of the fourth NMOS transistor.

Other features which are considered as characteristic for the invention are set forth in the appended claims.

Although the invention is illustrated and described herein as embodied in a drive circuit for a controllable semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic, fragmented, sectional view of a realization of D1, Q1 and M1 in a self-insulating fabrication process.

DESCRIPTION OF THE PREFERRED EMBODIMENTS

Figure 1:
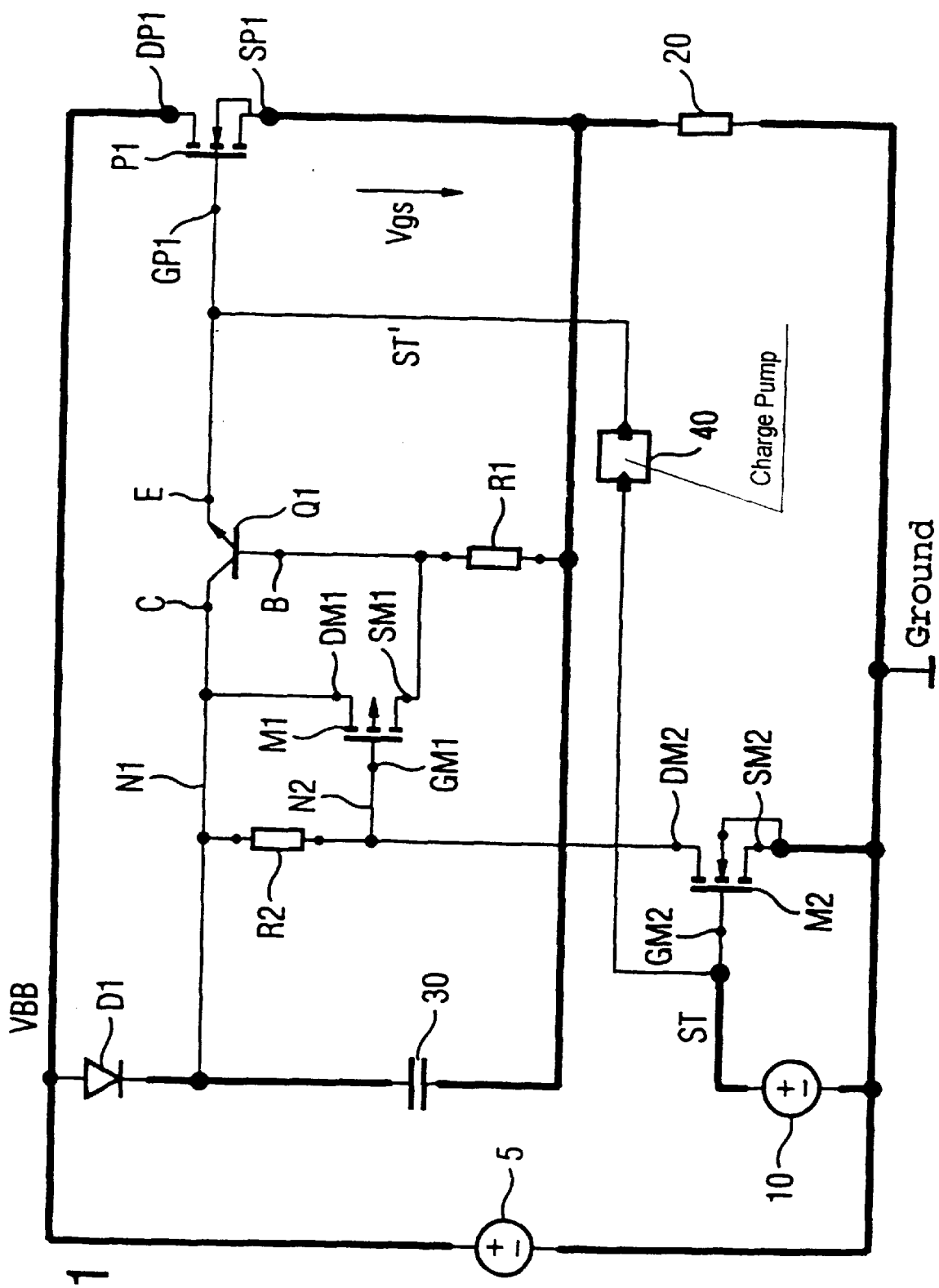
FIG. 1 is a circuit diagram of a first preferred embodiment of a drive circuit according to the invention.

In all the figures of the drawing, sub-features and integral parts that correspond to one another bear the same reference symbol in each case. Referring now to the figures of the drawing in detail and first, particularly, to FIG. 1 thereof, there is shown a first preferred embodiment of a drive circuit according to the invention. The reference symbol P1 designates a high-side NMOS power transistor, which is connected to a first reference potential VBB (a positive pole of a battery 5) at its first main terminal DP1 and is connected to a load 20 at its second main terminal SP1, the load 20 furthermore being connected to a second reference potential GROUND (a negative pole of the battery 5).

Reference symbol 30 designates a capacitor which is connected to the first reference potential VBB at its first terminal via a diode D1 for the purpose of charging and is connected to the second main terminal SP1 of the high-side NMOS power transistor P1 at its second terminal.

Reference symbol Q1 designates a switching device in the form of an NPN bipolar transistor whose collector terminal C is connected to the first terminal of the capacitor 30 (node N1), whose emitter terminal E is connected to a control terminal GP1 of the high-side NMOS power transistor P1 and whose base terminal B is connected via a first resistor R1 to the second main terminal SP1 of the high-side NMOS power transistor P1.

The switching device, that is to say the NPN bipolar transistor Q1, can be controlled in such a way that it feeds a charge stored in the capacitor 30 to the control terminal GP1 of the high-side NMOS power transistor P1 in the switched-on state, and does not do so in the switched-off state.

To that end, provision is made of a switching control device for controlling the NPN bipolar transistor Q1 in response to a control signal ST of a control signal generating device 10.

The switching control device has a first PMOS transistor M1, whose first main terminal DM1 is connected to the collector terminal C of the NPN bipolar transistor Q1 and whose second main terminal SM1 is connected to the base terminal B of the NPN bipolar transistor Q1. Furthermore, the switching control device has a second resistor R2, whose first terminal is connected to the first terminal of the capacitor device 30 (node N1). The switching control device also has a first NMOS transistor M2, whose first main terminal DM2 is connected to the second terminal of the second resistor R2 (node N2) and to the control terminal GM1 of the first PMOS transistor M1, whose second main terminal SM2 is connected to the second reference potential GROUND and whose control terminal is connected to the control signal ST.

Finally, the first embodiment contains a charge pump circuit 40 for receiving the control signal ST and outputting a potential-boosted control signal ST' to the control terminal GP1 of the high-side NMOS power transistor P1.

The method of operation of the drive concept in accordance with the first embodiment of the invention is now explained in more detail below.

The discrete capacitor 30 is charged via the diode D1 in the switched-off state of the high-side NMOS power transistor P1, that is to say the control signal ST is at L. In this case, the first PMOS transistor M1, which makes the base current available to the NPN bipolar transistor Q1, is switched off and the first NMOS transistor M2 is switched on.

The NPN bipolar transistor Q1 blocks the entire positive voltage VBB of the battery 5 by use of suitable driving in both directions, in particular in the forward direction. It is expedient, therefore, if the collector terminal C of the NPN bipolar transistor Q1 and hence also the cathode of the diode D1 (node N1) are formed by a substrate (see FIG. 3 and corresponding description further below). This is necessary in the case of a self-insulating process.

The resistor R1 connects the base terminal B of the NPN bipolar transistor Q1 to the second main terminal SP1 of the high-side NMOS power transistor P1 and thus ensures a fixedly defined base potential in the switched-off state.

In the switched-on state of the high-side NMOS power transistor P1, that is to say the control signal ST is at H, the discrete capacitor 30 is discharged via the NPN bipolar transistor to the control terminal GP1 of the high-side NMOS power transistor P1 and thus ensures a rapid switch-on.

In this case, the first PMOS transistor M1, which makes the base current available to the NPN bipolar transistor Q1, is switched on and the first NMOS transistor M2 is switched off.

Since the capacitor 30 and the control terminal GP1 of the high-side NMOS power transistor P1 can be discharged with time in the switched-on state, provision is made for the charge pump 40 to be connected in. As a result, the high-side NMOS power transistor P1 can remain permanently switched on for a longer period of time.

The considerations below reveal that it is expedient to further improve the first embodiment of the drive circuit according to the invention as shown in FIG. 1.

If the voltage of the battery 5 is large and Q1 is turned on, almost the full battery voltage VBB forms the voltage Vgs between the gate terminal GP1 and the source terminal SP1 of the high-side NMOS power transistor P1.

If the capacitor 30 is discharged, the base-emitter diode of the NPN bipolar transistor Q1 is reverse-biased by the voltage Vgs. However the gate oxide tolerates only a limited voltage. Likewise, the breakdown voltage of the emitter diode of the NPN bipolar transistor Q1 is limited. It is therefore expedient to limit Vgs.

Furthermore, the resistor R1 should have a low resistance in the switched-off state so that the breakdown voltage $V_{CE0}$ of the NPN transistor Q1 is not reduced to an excessively great extent. In the switched-on state, on the other hand, the resistor R1 should have a high resistance so that the capacitor 30 is not discharged unnecessarily. Therefore, an appropriate resistor is one that can be controlled in a state-dependent manner, for example a transistor.

Figure 2:
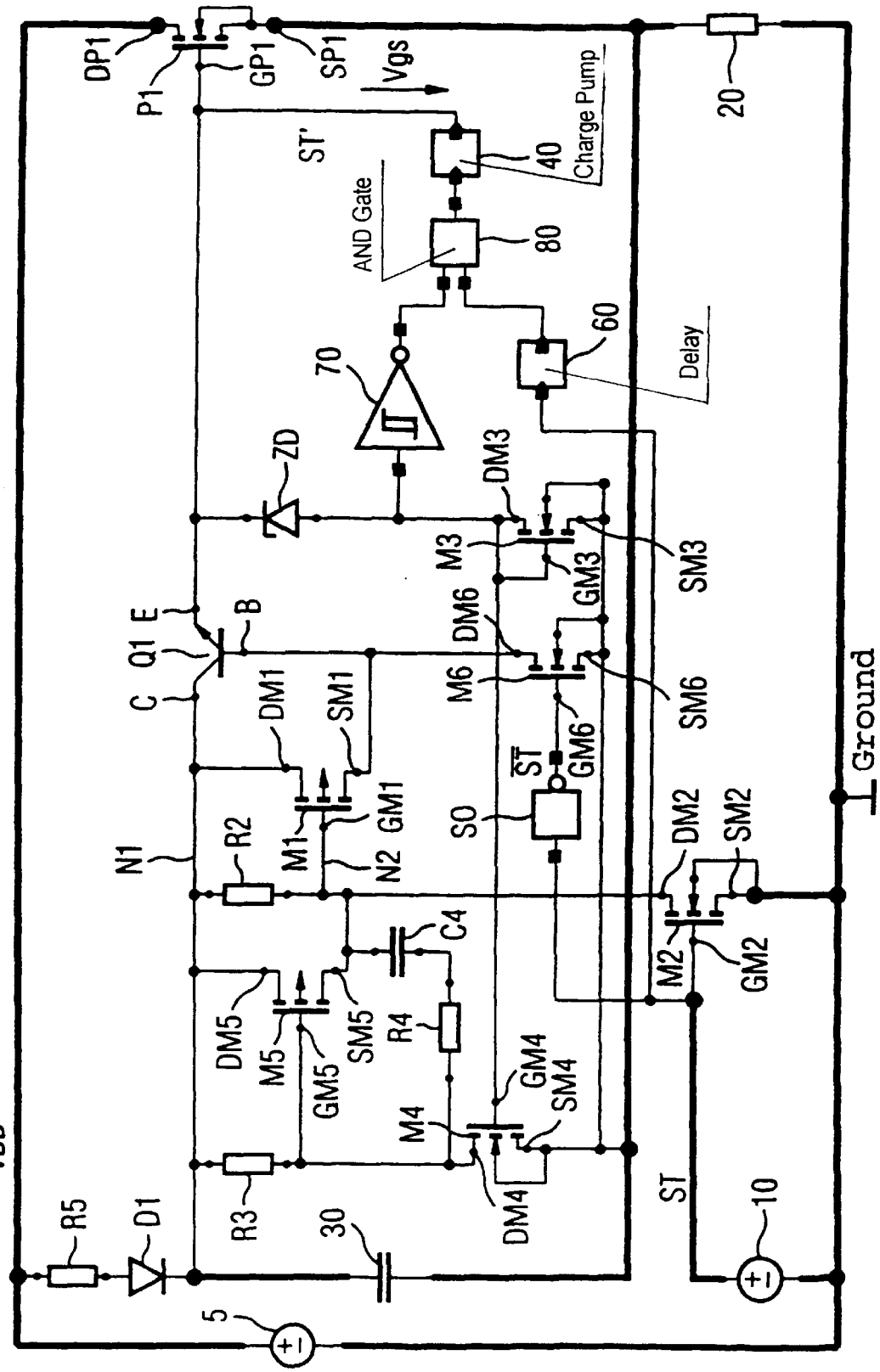
FIG. 2 is a circuit diagram of a second preferred embodiment of the drive circuit.

FIG. 2 shows a second preferred embodiment of the drive circuit according to the invention.

In the drive circuit shown in FIG. 2, the first resistor R1 of FIG. 1 is replaced by a second NMOS transistor M6, whose first main terminal DM6 is connected to the base terminal B of the NPN bipolar transistor Q1, whose second main terminal SM6 is connected to the second main terminal SP1 of the high-side NMOS power transistor P1 and whose control terminal GM6 is receives an inverted control signal/ST inverted by an inverter S0.

As a result, the base terminal B of the NPN transistor Q1 and the second main terminal SP1 of the high-side NMOS power transistor P1 are short-circuited in the switched-off state.

Moreover, the control terminal SP1 and the second main terminal SP1 of the high-side NMOS power transistor P1 are also short-circuited in the switched-off state by a pull-down circuit (not shown), in order that the full blocking capability of the NPN transistor Q1 is obtained as rapidly as possible.

Furthermore, in the second embodiment, provision is additionally made of a voltage limiting circuit connected between the control terminal GP1 and the second main terminal SP1 of the high-side NMOS power transistor P1 that serves to limit the gate to source voltage Vgs.

The voltage limiting circuit has a zener diode ZD, whose cathode terminal is connected to the control terminal GP1 of the high-side NMOS power transistor P1. The voltage limiting circuit further has a third NMOS transistor M3, whose first main terminal DM3 is connected to an anode terminal of the zener diode ZD, whose second main terminal SM3 is connected to the second main terminal SP1 of the high-side NMOS power transistor P1 and whose control terminal GM3 is connected to its first main terminal DM3.

The voltage limiting circuit limits, in particular, the overvoltage generated by the charge pump 40, since the charge pump 40 supplies only a small current.

In the second embodiment, the potential at the control terminal GM3 of the third NMOS transistor M3 is furthermore used to activate or to deactivate the charge pump 40 as a function of the voltage Vgs by a charge pump activation circuit.

In particular, the charge pump activation circuit has a delay device 60 for receiving and delaying the control signal ST, an inverter device 70, exhibiting hysteresis, for receiving and inverting the potential present at the first control terminal GM3 of the third NMOS transistor M3, and an AND gate 80 for receiving the output signals of the delay device 60 and of the inverter device 70 exhibiting hysteresis, and for outputting a correspondingly logically combined output signal for activating the charge pump 40. The time constant of the delay of the delay device 60 is of the order of magnitude of the switch-on time with the bootstrap capacitor 30.

As long as Vgs is limited, then Vgs is large enough, in other words the charge pump 40 is not required. During or shortly after the switch-on process, the voltage Vgs cannot yet be large, but the charge pump 40 does not afford a remedy since it is slow or weak. The delay due to the switch-on of the charge pump 40, the switch-on being delayed by the delay device 60, is thus negligible. Therefore, the charge pump 40 does not run at all during straightforward PWM (pulse width modulation) operation in the high frequency range and, therefore, also does not generate any EMC interference (electromagnetic compatibility). The charge pump 40 runs only after the delay time of the delay device 60 has lapsed and under the condition that Vgs is not limited, that is to say is not large enough, for example because the capacitor 30 is not connected or the gate capacitance of the high-side NMOS power transistor P1 is discharged. This embodiment thus also guarantees the switch-on without the capacitor 30 and a steady-state switched-on operation.

As mentioned above, the voltage limiting circuit having the zener diode ZD and the "MOS diode" M3 primarily serves for limiting the overvoltage of Vgs caused by the charge pump 40. However, the overvoltage can also be caused by the capacitor 30. As a rule, however, the diode chain ZD, M3 cannot limit such an overvoltage since the capacitor 30 has a large capacitance and the battery voltage VBB is large and may have large fluctuations. In addition, as a result of such a discharge, the recharging of the capacitor 30 would necessitate a high charging current and a relatively long time.

Therefore, in the second embodiment, provision is additionally made of a voltage regulating circuit for detecting the voltage Vgs located between the control terminal GP1 and the second main terminal SP1 of the semiconductor component P1 and regulating the driving of the NPN bipolar transistor Q1 as a function thereof.

The voltage regulating circuit has a third resistor R3 whose first terminal is connected to the first terminal of the capacitor 30. A fourth NMOS transistor M4 is provided in the voltage regulating circuit whose first main terminal DM4 is connected to the second terminal of the third resistor R3, whose second main terminal SM4 is connected to the second main terminal SP1 of the high-side NMOS power transistor P1 and whose control terminal GM4 is connected to the control terminal GM3 of the third NMOS transistor M3. The voltage regulating circuit also has a second PMOS transistor M5 whose first main terminal DM5 is connected to the first terminal of the capacitor 30, whose second main terminal SM5 is connected to the control terminal GM1 of the first PMOS transistor M1 and whose control terminal GM5 is connected to the second terminal of the third resistor R3.

A series circuit formed by a fourth resistor R4 and a second capacitor C4 is provided, for the purpose of stabilizing the regulation between the second main terminal SM5 of the second PMOS transistor M5 and the first main terminal DM4 of the fourth NMOS transistor M4.

A resistor R5 serves for limiting the charging current of the capacitor 30.

The potential at the control terminal of the third NMOS transistor M3, which actually indicates the voltage limiting by the diode chain ZD, M3, also supplies the signal for the regulation of the first PMOS transistor M1 and thus also of the NPN bipolar transistor Q1. The level of this signal is converted upward toward the node N1 by the fourth NMOS transistor M4 and the resistor R3 and the control terminal SM1 of the first PMOS transistor M1 is regulated by the second PMOS transistor M5.

FIG. 3 shows an illustration of the realization of D1, Q1 and M1 in a self-insulating fabrication process.

In FIG. 3, reference symbol 100 designates an $N^+$-type substrate, 110 an $N^-$-type epitaxial layer, 120 a first $N^+$-type region, 130 a first $P^+$-type region, 140 a first P-type region, 150 a second $P^+$-type region, 160 a gate electrode, 170 a third $P^+$-type region, 180 a second P-type region, 190 a second $N^+$-type region and 200 a fourth $P^+$-type region.

The first $N^+$-type region 120 forms the node N1 in FIGS. 1 and 2. It is connected to a drain terminal of the first PMOS transistor M1, which has the first $P^+$-type region 130 as a drain and the first P-type region 140 and also the second $P^+$-type region 150 as a source with an $N^-$-type channel situated in between, above which the gate electrode 160 is situated. The gate electrode 160 is connected to the node N2 in FIGS. 1 and 2.

A source terminal of the transistor M1 is connected to the third $P^+$-type region 170, which, together with the second P-type region 180, forms the base of the NPN transistor Q1, whose collector is formed by the $N^-$-type region 110 and whose emitter is formed by the $N^+$-type region 190. The collector is connected to the gate terminal of the NMOS power transistor P1.

Finally, the fourth $P^+$-type region 200, together with the $N^-$-type region 110, forms the diode D1, which is connected to the first reference potential VBB on the anode side and to the node N1 on the cathode side.

In accordance with the requirements, the diode D1 has a high blocking capability and the NPN transistor Q1 has a high blocking capability and a high gain. The first PMOS transistor M1 also has a high blocking capability. The realization shown saves area and is extremely robust.

Although the present invention has been described above using two preferred exemplary embodiments, it is not restricted to these but rather can be modified in diverse ways.

The controllable semiconductor component used may be not only the NMOS power transistor shown but also a PMOS power transistor or any other controllable semiconductor components, such as, for example, IGBTs or thyristors.

The voltage limiting circuit can be set to a desired voltage limiting by any desired combination of zener diodes and MOS diodes.

The drive circuit can be fabricated not only by the self-insulating process shown but also by a process affording better insulation, such as junction isolation (JI) or double isolation (DI).

I claim:

1. In combination with a semiconductor component having a first main terminal connected to a first reference potential, a second main terminal connected to a second reference potential via a load, and a control terminal, a drive circuit for driving the semiconductor component, the drive circuit comprising:

a control signal generating device generating a control signal for switching the semiconductor component on and off, said control signal generating device having a circuit section operating according to a bootstrap principle and serving for switching on the semiconductor component;

a diode having a first terminal connected to the first reference potential and a second terminal;

a capacitor device having a first terminal connected to said second terminal of said diode for charging said capacitor device via the first reference potential and a second terminal connected to the second main terminal of the semiconductor component;

a series circuit formed of a series resistor and a first controllable NMOS transistor having a control terminal receiving the control signal from said control signal generating device, said series circuit connected between said first terminal of said capacitor device and the second reference potential;

a controllable PMOS transistor having a control terminal connected to a junction point between said series resistor and said first controllable NMOS transistor, a first main terminal connected to a junction point between said diode and said capacitor device, and a second main terminal;

an NPN bipolar transistor having a collector terminal connected to said first terminal of said capacitor device, an emitter terminal connected to the control terminal of the semiconductor component, and a base terminal connected to said second main terminal of said controllable PMOS transistor;

an inverter receiving said control signal from said control signal generating device and outputting an inverted control signal; and a resistor device having a second controllable NMOS transistor with a first main terminal connected to said base terminal of said NPN bipolar transistor, a second main terminal connected to the second main terminal of the semiconductor component, and a control terminal receiving the inverted control signal from said inverter.

2. The drive circuit according to claim 1, including a charge pump circuit receiving the control signal and outputting a boosted control signal to the control terminal of the semiconductor component.

3. The drive circuit according to claim 1, wherein the semiconductor component is an NMOS power transistor.

4. The drive circuit according to claim 2, including a voltage limiting circuit connected between the control terminal of the semiconductor component and the second main terminal of the semiconductor component and serving to limit a gate-source voltage of the semiconductor component.

5. The drive circuit according to claim 4, wherein said voltage limiting circuit includes:

a zener diode with an anode terminal and a cathode terminal connected to the control terminal of the semiconductor component; and a third controllable NMOS transistor with a first main terminal connected to said anode terminal of said zener diode, a second main terminal connected to the second main terminal of the semiconductor component, and a control terminal connected to said first main terminal of said third controllable NMOS transistor.

6. The drive circuit according to claim 5, including a charge pump activation circuit for activating said charge pump circuit in dependence on the source-gate voltage of the semiconductor component.

7. The drive circuit according to claim 6, wherein said charge pump activation circuit includes:

a delay device for receiving and delaying the control signal and outputting delay output signals;

a further inverter device, exhibiting hysteresis, for receiving and inverting a potential present at said first control terminal of said third controllable NMOS transistor resulting in and outputting inverted output signals; and an AND gate device receiving the delay output signals of said delay device and the inverted output signals of said further inverter device exhibiting hysteresis, said AND gate device outputting a correspondingly logically combined output signal for activating said charge pump circuit.

8. The drive circuit according to claim 1, including a voltage regulating circuit for detecting a gate-source voltage between the control terminal of the semiconductor component and the second main terminal of the semiconductor component and for regulating a driving of said NPN bipolar transistor in dependence on the gate-source voltage.

9. The drive circuit according to claim 8, wherein said voltage regulating circuit includes:

a further resistor device having a first terminal connected to said first terminal of said capacitor device and a second terminal;

a third controllable NMOS transistor having a first main terminal, a second main terminal and a control terminal;

a fourth controllable NMOS transistor having a first main terminal connected to said second terminal of said further resistor device, a second main terminal connected to the second main terminal of the semiconductor component, and a control terminal connected to said control terminal of said third controllable NMOS transistor; and a further controllable PMOS transistor having a first main terminal connected to said first terminal of said capacitor device, a second main terminal connected to said control terminal of said controllable PMOS transistor and a control terminal connected to said second terminal of said further resistor device.

10. The drive circuit according to claim 9, including a further series circuit formed by another resistor device and a further capacitor device, said further series circuit stabilizing a regulation between said second main terminal of said further controllable PMOS transistor and said first main terminal of said fourth controllable NMOS transistor.

* * * * *